(12) United States Patent
Daubenspeck et al.

(10) Patent No.: US 7,682,961 B2
(45) Date of Patent: Mar. 23, 2010

(54) METHODS OF FORMING SOLDER CONNECTIONS AND STRUCTURE THEREOF

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 293 days.

(21) Appl. No.: 11/422,979

(22) Filed: Jun. 8, 2006

(65) Prior Publication Data

US 2007/0287278 A1    Dec. 13, 2007

(51) Int. Cl.
*H01L 21/44* (2006.01)

(52) U.S. Cl. .............................. 438/615; 257/E21.508; 438/613; 438/614

(58) Field of Classification Search ................. 438/612, 438/613, 614, 615; 257/E21.508
See application file for complete search history.

(56) References Cited

U.S. PATENT DOCUMENTS

| | | | |
|---|---|---|---|
| 6,743,660 B2 | 6/2004 | Lee et al. | |
| 6,780,751 B2 * | 8/2004 | Fay | 438/613 |
| 6,853,076 B2 | 2/2005 | Datta et al. | |
| 6,917,106 B2 | 7/2005 | Datta | |
| 6,930,032 B2 * | 8/2005 | Sarihan et al. | 438/614 |
| 7,081,404 B2 * | 7/2006 | Jan et al. | 438/613 |
| 7,112,522 B1 * | 9/2006 | Tsao et al. | 438/612 |
| 2002/0173134 A1 * | 11/2002 | Viswanadam et al. | 438/613 |
| 2003/0124832 A1 * | 7/2003 | Tseng et al. | 438/613 |
| 2005/0104090 A1 * | 5/2005 | Juengling | 257/211 |
| 2005/0208748 A1 | 9/2005 | Srivastava et al. | |
| 2005/0224966 A1 | 10/2005 | Fogel et al. | |

* cited by examiner

*Primary Examiner*—Asok K Sarkar
(74) *Attorney, Agent, or Firm*—Richard M. Kotulak; Greenblum & Bernstein P.L.C.

(57) ABSTRACT

In a first aspect, a method comprises depositing a first metal containing layer into a trench structure, which contacts a metalized area of a semiconductor structure. The method further includes patterning at least one opening in a resist to the first metal containing layer. The opening should be in alignment with the trench structure. At least a pad metal containing layer is formed within the at least one opening (preferably by electroplating processes). The resist and the first metal layer underlying the resist are then etched (with the second metal layer acting as a mask, in embodiments). The method includes flowing solder material within the trench and on pad metal containing layer after the etching process. The structure is a controlled collapse chip connection (C4) structure comprising at least one electroplated metal layer formed in a resist pattern to form at least one ball limiting metallurgical layer. The structure further includes an underlying metal layer devoid of undercuts.

34 Claims, 4 Drawing Sheets

METHODS OF FORMING SOLDER CONNECTIONS AND STRUCTURE THEREOF

FIELD OF THE INVENTION

The invention relates to a method of forming solder connections onto a semiconductor device and more particularly a method of forming solder connections while limiting or eliminating undercut on an underlying one or more layer, and a resulting device.

BACKGROUND OF THE INVENTION

A solder connection on a semiconductor device includes several metal containing materials, including the solder bump itself which usually comprises low melting metal alloys or metal mixtures based on tin or lead. Less obvious are the materials underneath the solder bump which bridge the conductive connection between the solder bump and the first metallization contact that is formed at the back end of line processes of a semiconductor device. These under bump materials (UBM) are also referred to as the ball limiting metallurgical (BLM) layers, since they form the foundation of the solder bump and the solder material holds only at the area where the ball limiting metals are present.

In one conventional method, a refractory laminate of sputtered BLM films is wet etched after C4 (controlled collapse chip connection) plating using the C4 as the etch mask. For lead free (Pb-free) or lead reduced (Pb-reduced) processing, the top layer of the BLM typically comprises copper or copper and an additional barrier film such as nickel or nickel alloy, the barrier layer typically being electroplated. In the case for which the top layer is copper, the copper reacts with the tin based solder material to form an intermetallic CuSn barrier layer which is important to the reliability of the Pb-free or Pb-reduced C4 bump. In the case of copper and barrier material (e.g. Ni or $Ni_x$) the barrier prevents interdiffusion of Sn and Cu, while the Cu serves as a conductive layer to enhance electroplating of Ni.

When the copper and underlying films are wet-etched (using the solder bump and/or the Ni barrier as an etch mask), there rises the problem of under bump corrosion or undercut. This wet etch undercut is variable, and has the effect of reducing the BLM footprint at the joining interface between BLM and C4. This under bump corrosion can reach dimensions of up to 10 μm of lateral lost space intended for metal contacts. This, in turn, reduces the potential integrity of bump attachment.

As semiconductor devices become smaller, a need for smaller solder connection is also required. In such case, as the C4 pitch becomes smaller, process control becomes even more critical with respect to the reliability and utility of the final C4 structure since a relatively consistent undercut per edge represents a greater threat to the integrity of the final overall C4 structure. Also, it should be understood that as semiconductor devices become smaller, a point is reached where a 10 μm undercut is not acceptable and will significantly degrade device performance.

Accordingly, there exists a need in the art to overcome the deficiencies and limitations described hereinabove.

SUMMARY OF THE INVENTION

In a first aspect of the invention, a method comprises depositing a first metal containing layer into a trench structure, which contacts a metalized area of a semiconductor structure. The method further includes patterning at least one opening in a resist to the first metal containing layer. The opening should be in alignment with the trench structure. At least a pad metal containing layer is formed within the at least one opening (preferably by electroplating processes). The resist and the first metal layer, underlying the resist, are etched (with the second metal layer acting as a mask, in embodiments). The method includes flowing solder material within the trench and on pad metal containing layer after the etching process.

In further embodiments, the method comprises forming a passivation layer under the first metal layer and forming an opening in the passivation area to form the trench structure. The passivation layer comprises at least one of silicon nitride, silicon oxide and polyimide. The first metal containing layer comprises at least one of tantalum, titanium and titanium-tungsten alloy. The etching may occur after the solder is provided. The first metal containing layer is deposited by physical vapor deposition.

The second metal containing layer comprises copper, and may be deposited by electroplating. The pad metal containing layer is between about 1 to about 2 μm thick. A longitudinal dimension of the second metal layer is controlled by the resist pattern. In the case for which Ni-BLM pad/barrier top layer is used above the copper, both the copper and the barrier layer are deposited by electroplating.

If a solder plating process is used, the solder material is placed within the trench structure prior to the etching of the resist. In this case, the solder material is used as a mask to etch the first metal containing layer, after the stripping removal of the resist. However, if a physical solder transfer process is used, the resist mask is stripped prior to solder transfer. In this solder transfer case, the resist mask is first stripped and then the BLM layers beneath the Cu can be wet etched or RIE'd (reactive ion etched) using the Cu or Cu+barrier layers as the mask. The solder material comprises lead-free tin-containing material or leaded solder The etching of the BLM base layer preferably comprises reactive ion etching and the longitudinal size of the solder connection after flowing is determined by a longitudinal dimension of the pad metal containing layer. After the etching, the remaining first metal containing layer and the pad metal containing layer form a ball limiting metallurgical (BLM) layer.

The flowing of the solder comprises a multitude of solder connections formed from a mold comprising solder materials. The pad metal containing layer acts as a mask during the etching. The etching is a dry etching which preserves a dimensional integrity of the first metal containing layer thereby preventing undercut.

BRIEF DESCRIPTION OF THE DRAWINGS

FIGS. 1c' and 1d' show alternative processing steps in accordance with the invention.

DETAILED DESCRIPTION OF EMBODIMENTS OF THE INVENTION

The invention relates to a method for forming a solder connection on a semiconductor device. In embodiments, the method of the invention reduces, if not entirely eliminates, corrosion or undercut of underlying layers of the solder connection. The present invention further permits dimensional integrity of the solder bump, i.e., the size of the solder connection is controlled by dimensions of the underlying metal layer(s). In embodiments, the method includes the application of a resist pattern to limit the location, size and shape of parts of the under bump metallization layers.

In embodiments, the invention implements a combination of sputtered and electroplated BLM for lead reduced or lead free C4 (controlled collapse chip connection) manufacturing. In embodiments, a lower TiW/Ti (or equivalent) barrier layer is sputtered deposited (PVD); whereas, a thicker copper top layer (or copper plus barrier layer; approximately 1-3 µm) is electroplated through a spin on resist film. In embodiments, the TiW/Ti barrier layer is approximately 0.6 µm thick which is electrically adequate for the C4 plating process. The electroplating of the copper results in copper being placed in its final position so that its metrologically true to the designed or intended dimension. After resist strip, the underlying BLM films are preferably RIE patterned, with either the plated Cu pad or the full C4 structure (after mold transfer in the case of C4NP) as the mask. In this method, each BLM layer comprising the C4 pad structure can be defined with a higher degree of pattern integrity than has previously been possible. This is also true for a nickel-type barrier layer if used on top of the copper layer. After resist strip, the underlying BLM films are then preferably RIE patterned, with either the plated Cu pad or the diffusion barrier pad or the full C4 structure (after mold transfer). This, in turn, translates into improved manufacturability and a reduced risk with respect to the ultimate reliability of the structure.

Figure 1A:
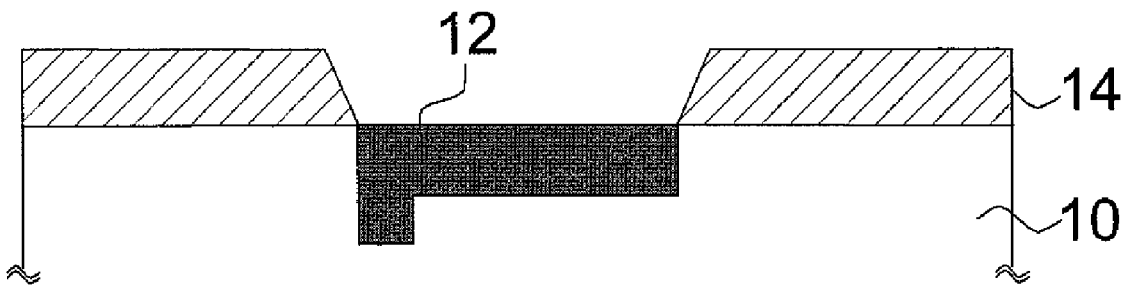
FIGS. 1a-1f show processing steps in accordance with an embodiment of the invention.

FIG. 1a shows processing steps in accordance with the invention. The process steps include the formation of a metallization layer 12 on a semiconductor structure 10, prior to a soldering process. The layer 10 comprises mostly non-conductive material such as silicon oxide or silicon nitride and can be of any desired thickness. The metallization layer 12 comprises any metal containing material or pure metal, such as and not limited to, copper or aluminum. The metallization layer 12 also represents the desired location of the solder connection on the semiconductor structure; although, it should be understood that other locations of solder connections are contemplated by the invention. For example, the first metallization layer 12 can be a trench which leads to a semiconductor gate within the layer 10. Although not shown, a liner may be provided underneath the layer 12.

A passivation material 14 is patterned in a conventional manner to form a trench, exposing portions of the underlying layer 12. In embodiments, the passivation material 14 is electrically inactive or non-conductive and may comprise several layers, such as silicon nitride layers or silicon oxide layers, but preferably polyimide layers. It should be understood, though, that other non-conductive or passivated materials are also contemplated by the invention.

Figure 1B:
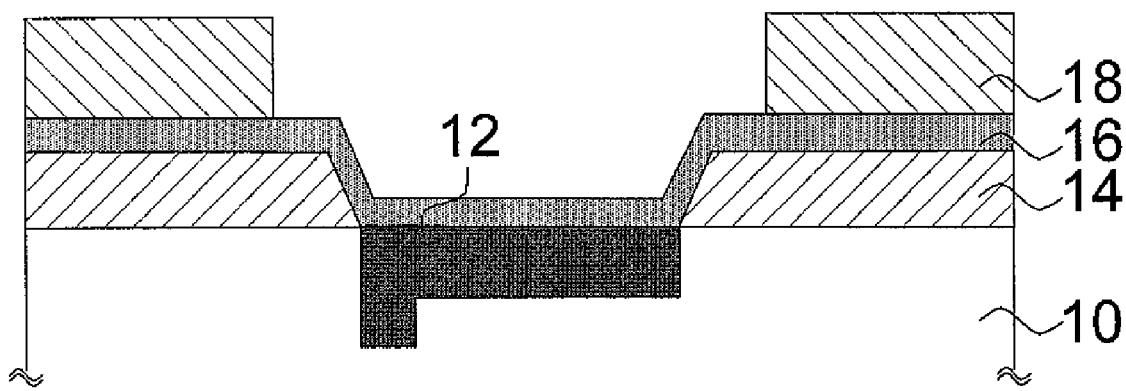

FIG. 1b shows further processing steps in accordance with the invention. In these processing steps, a metal containing layer 16 is formed over the layer 12 and the layer 10. A resist 18 is then applied over the layer 16 and patterned to form an opening. The metal containing layer 16 can be applied by any method known in the art, for example, by Physical Vapor Deposition (PVD) or sputtering. The metal containing layer 16, in embodiments, serves as a conductive base for electroplating, and may be of any appropriate thickness, known to those of skill in the art, and is only limited to a size to ensure an accurate electroplating process.

In embodiments, the metal containing layer 16 can be between about 0.1 and 1.0 µm thick, preferably between about 0.2 and 0.8 µm and most preferably about 0.6 µm. Also, the material of the metal containing layer 16 can vary and may include titanium or tungsten-titanium alloys, mixtures thereof or any equivalents. Furthermore, the metal containing layer 16 can comprise any metallic layer to improve the physical and chemical properties of the connection. For example, the metal containing layer 16 can comprise tantalum nitride.

The resist layer 18 comprises a resist material and can be applied by any known method by those of skill in the art. The resist layer 18 can have any desired pattern and forms a template for the finished solder connections. Therefore, the resist layer 18 determines the size, location and shape of the ball limiting layer of the solder connection.

It is contemplated by the invention that the resist can have several openings to the metal containing layer 16, thereby preparing a device with any number of solder connections simultaneously. The resist layer 18 can be of any thickness and is only limited by the thickness of the layer that is placed into the openings. Within the scope of the invention, the thickness of the resist layer 18 can be between 1.0 and 5.0 µm; although, other thicknesses are contemplated by the invention.

Figure 1C:
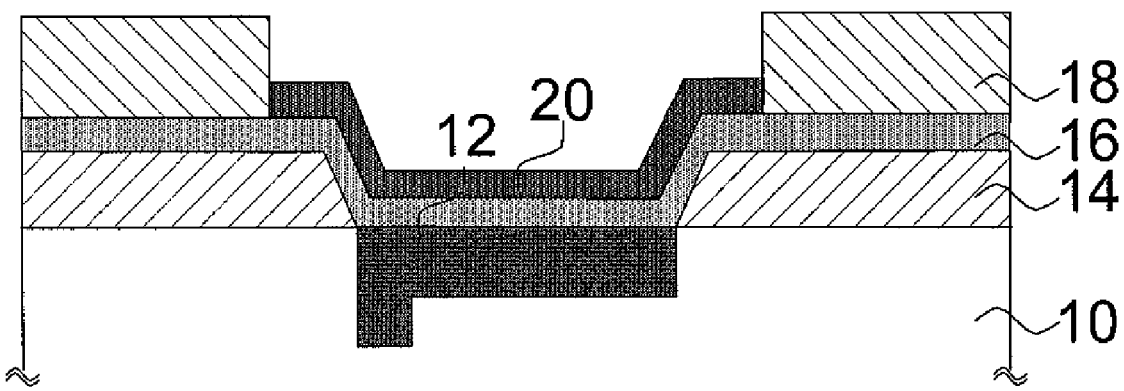

FIG. 1c shows further processing steps in accordance with the invention. In these processing steps, a metal containing layer 20 is provided on the layer 16 within the opening formed in the resist layer 18. The metal containing layer 20 can be any material used as under bump metallization material or mixtures thereof. In embodiments, the metal containing layer 20 comprises copper; although, other materials are contemplated by the invention. In embodiments, the metal containing layer 20 is provided by electroplating, which allows for a controlled homogenous growth only at locations where metal containing layer 16 is exposed, for example.

In embodiments, the metal containing layer 20 will act as a pad for the solder, as well as a mask for subsequent etching steps. The metal containing layer 20 can be grown to any thickness and, in embodiments, is between about 0.5 and 5 µm thick, preferably between about 0.5 and 3 µm, and most preferably between about 2 and 3 µm.

Figure 1D:
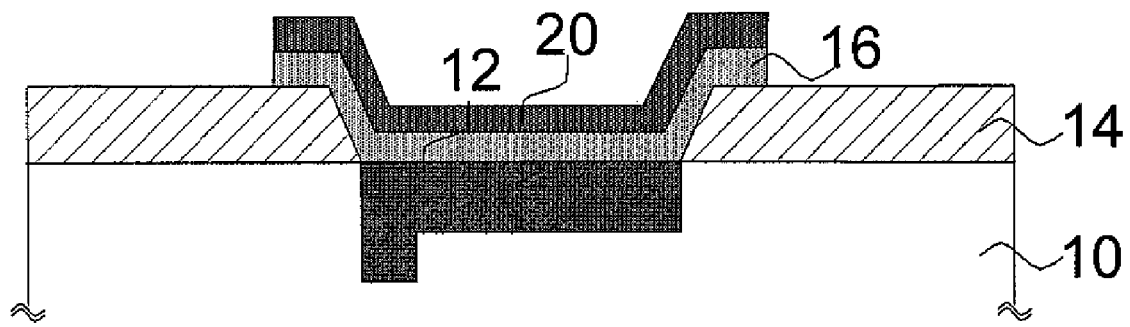

FIG. 1d shows additional processing steps in accordance with the invention. In these processing steps, the resist layer 18 and portions of the underlying metal containing layer 16 (not covered by metal containing layer 20) are removed by a wet or dry etching process. In this processing, the layer 20 serves as a mask. Preferably, if anisotropic methods such as reactive ion etching are used, the dimensional integrity of metal containing layer 20 and metal containing layer 16 are preserved; that is, there is substantially no undercut or corrosion. This maintains the integrity of the solder connection, especially in smaller dimensioned devices. If isotropic methods such as wet etching are used, a lateral corrosion into metal containing layers 16 and 20 may occur, which is to a significantly lesser degree than in methods used previously in the art.

Figure 1E:
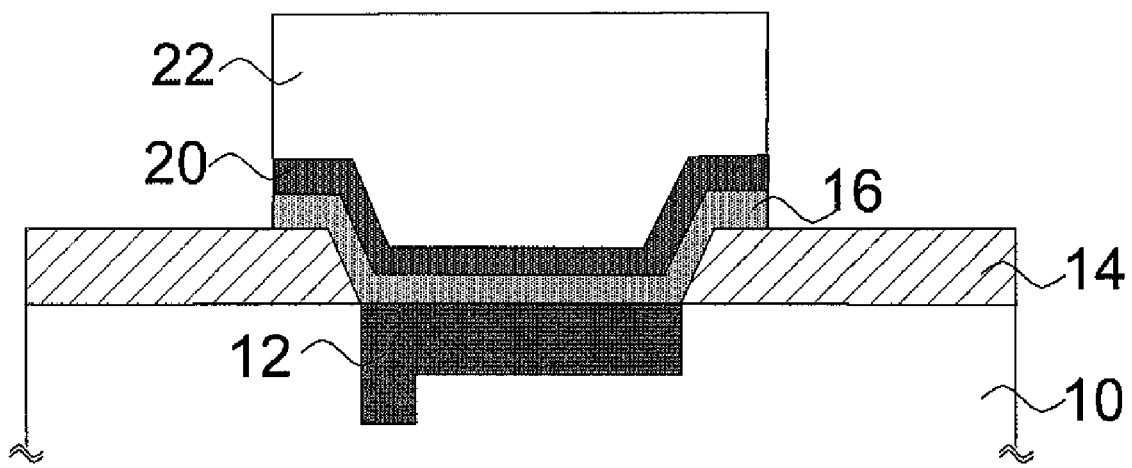

FIG. 1e depicts the under bump metallization layers 16 and 20 with solder material in place, in accordance with the invention. The solder material can be of any appropriate material including, for example, lead free ($Pb^f$) or lead reduced ($Pb^r$) solder material. Furthermore, the solder material can be applied by any method, with a preferred method being a C4 method (controlled collapse chip connection).

Figure 1F:
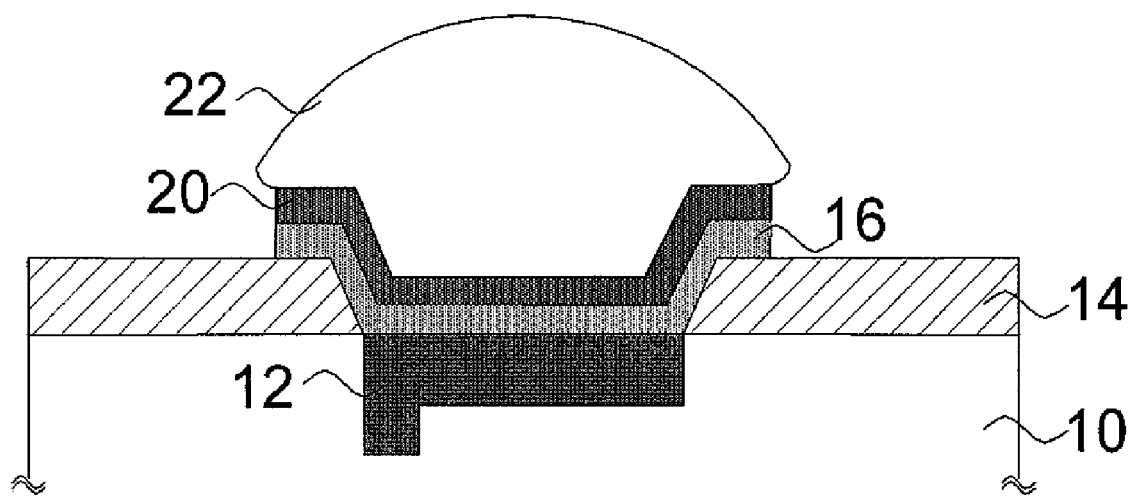
Figure 1C:
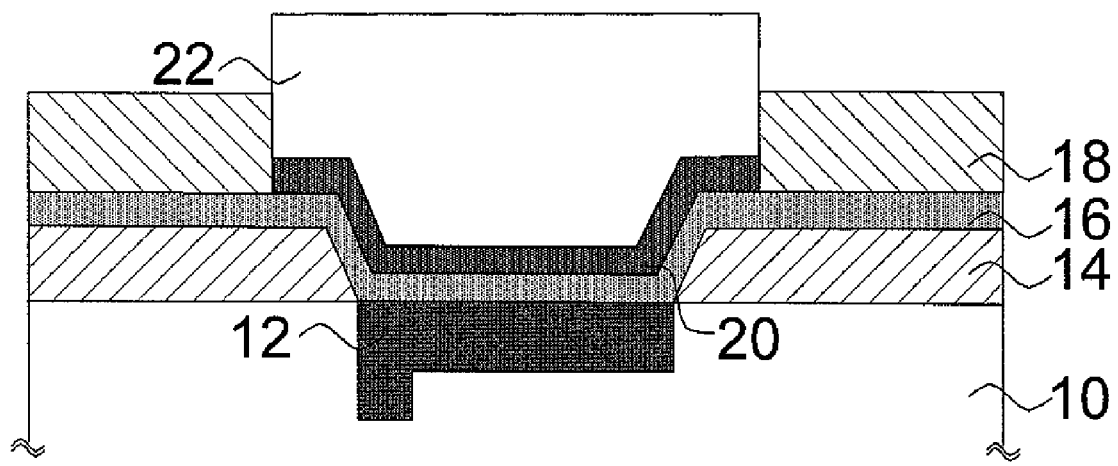
Figure 1D:
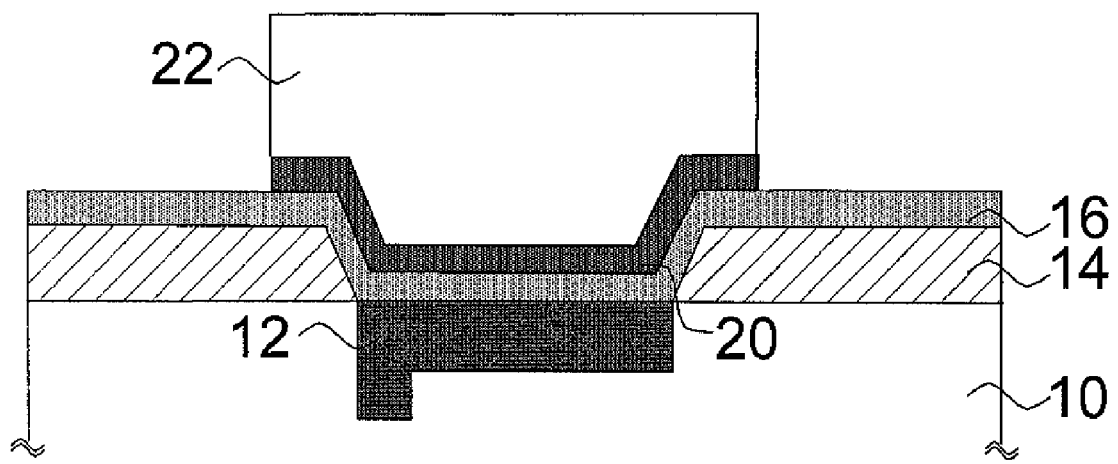

In the C4 process, a prepared solder piece is fitted to the under bump metallization element and placed on the metal containing layer 20. The structure then undergoes reflowing. By using the method of the invention, the solder bump—at its base—takes the shape and dimension of the under bump material and further melts into its typical concave bump shape. Any excess of solder material flows off the structure and can be easily removed. FIG. 1f depicts the finished solder bump connection with dimensional integrity based on the preparation of the under bump metallization, i.e., metal containing layer 20.

Alternatively, the order of the process can be changed and the solder material can be attached prior to the removal of the resist or prior to the etching of layer 16. This process is depicted by FIGS. 1c' and 1d' (which replace FIGS. 1c and 1d, respectively). By way of example, in FIG. 1c', solder material 22 is placed onto the device after the electroplating and in FIG. 1d', the material 22 is placed after the resist 18 has been removed and prior to the etching. In this embodiment, if the solder material is prepared with accurate dimensions, the layer 22 serves as mask and protects the metal containing layers 16 and 20 from any detrimental damages due to the etching method. Damages that occur to material 22 during the etching are superficial and eliminated during the reflow process.

Additionally, the present invention is applicable to manufacturing a series of solder bumps simultaneously on the same semiconductor device or wafer. In such embodiments, the resist pattern 18 is created to provide plural openings at all desired solder bump locations across the surface of the device or wafer. At any point after electroplating the device or wafer, the solder material can be applied using, for example, the C4 process.

While the invention has been described in terms of embodiments, those skilled in the art will recognize that the invention can be practiced with the modification within the spirit and scope of the appended claims. For example, the invention can be readily applicable to bulk substrates.

What is claimed is:

1. A method comprising:
   depositing a first metal containing layer into a trench structure, which contacts a metalized area within a semiconductor structure;
   patterning at least one opening, in a resist, to the first metal containing layer, the opening being in substantial alignment with the trench structure;
   forming at least a pad metal containing layer or bilayer within the at least one opening;
   stripping the resist and etching the first metal layer underlying the resist; and
   flowing solder material within the trench structure and on the pad metal containing layer to form a solder bump extending within the trench structure.

2. The method according to claim 1, further comprising forming a passivation layer under the first metal layer and forming an opening in the passivation layer to form the trench structure.

3. The method of claim 2, wherein the passivation layer comprises at least one of silicon nitride, silicon oxide and polyimide.

4. The method according to claim 1, wherein the first metal containing layer comprises at least one of the class of refractory metals or their alloys including titanium, tungsten, titanium-tungsten alloy.

5. The method according to claim 1, wherein the solder material is provided after the resist stripping.

6. The method according to claim 1, wherein the first metal containing layer is deposited by physical vapor deposition.

7. The method according to claim 1, wherein the pad metal containing layer comprises copper or copper with a diffusion barrier metal including nickel or alloys of nickel.

8. The method according to claim 1, wherein the pad metal containing layer or bilayer is deposited by electroplating.

9. The method according to claim 1, wherein the pad metal containing layer is between about 2 to about 3 μm thick.

10. The method according to claim 1, wherein a longitudinal dimension of the pad metal layer is controlled by the resist pattern.

11. The method according to claim 10, wherein a longitudinal size of the solder connection, after flowing, is determined by a longitudinal dimension of the pad metal containing layer or the opening.

12. The method according to claim 1, wherein the solder material is placed within the trench prior to the etching of the resist.

13. The method according to claim 12, wherein the solder material is used as a mask to etch the first metal containing layer after the etching of the resist.

14. The method according to claim 1, wherein the solder material comprises lead free tin containing material or lead reduced tin containing material.

15. The method according to claim 1, wherein the etching comprises reactive ion etching.

16. The method according to claim 1, wherein, after the etching, the remaining first metal containing layer and the pad metal containing layer form a ball limiting metallurgical (BLM) layer.

17. The method according to claim 1, wherein the flowing of the solder comprises a multitude of solder connections formed from a mold comprising solder material.

18. The method according to claim 1, wherein the pad metal containing layer or bilayer acts as a mask to an underlying layer during the etching.

19. The method according to claim 1, wherein the etching is a dry etching which preserves a dimensional integrity of the first metal containing layer thereby preventing undercut.

20. The method of claim 1, wherein the trench structure comprises an upper surface, and a portion of the solder bump is formed below the upper surface.

21. A method for reducing corrosion of under bump metallization material during formation of a solder bump on a semiconductor structure comprising:
   forming a passivated layer with a trench over at least a metallized layer within a structure;
   forming a first metal containing layer within the trench;
   controlling a size of at least a second metal containing layer by patterned resist;
   etching the patterned resist and portions of the first metal containing layer under the patterned resist, while protecting remaining portions of the first metal containing layer with the second metal containing layer; and
   reflowing solder material on the second metal containing layer to form a solder bump,
   wherein the first metal containing layer is substantially devoid of an undercut, controlled during the etching step.

22. The method according to claim 21, wherein the solder material is attached prior to etching of the resist and is used as a mask.

23. The method according to claim 21, wherein the solder bump has a dimensional size of the second metal containing layer, controlled by the resist pattern.

24. The method according to claim 21, wherein solder material is formed from a mold comprising solder material at locations that overlap with the trench of the passivated layer.

25. The method of claim 21, wherein the passivated layer is planar.

26. The method of claim 21, wherein the trench comprises an upper surface, and a portion of the solder bump is formed below the upper surface.

27. A method for controlling dimensions of a solder bump during formation of the solder bump comprising:

forming a resist pattern having at least one opening configured for solder bumps;

electroplating a metal layer within the at least one opening;

removing the resist pattern and a portion of an underlying metal layer, which is in contact with a metallized layer within a structure;

providing solder material on the electroplated metal; and reflowing the solder material to form a solder bump extending within a trench structure formed in an underlying passivation layer.

28. The method according to claim 27, wherein the solder material is filled before the resist pattern is removed.

29. The method according to claim 28, wherein the solder material is used as a mask for etching.

30. The method according to claim 27, wherein the at least one opening limits longitudinal dimensions of the electroplated material.

31. The method according to claim 30, wherein the longitudinal dimensions of the electroplated material sets dimensions of the solder bump.

32. The method of claim 27, wherein the trench structure comprises an upper surface, and a portion of the solder bump is formed below the upper surface.

33. A method comprising:

sputtering a first metal containing layer onto a structure having a metal formation within the structure;

forming a passivation layer having a trench in alignment with the metal formation;

patterning a resist on the first metal containing layer to form opening to the first metal containing layer;

electroplating a second metal containing layer in opening bound by the resist;

removing the resist and the first metal layer underlying the resist, using the second metal containing layer as a mask;

attaching solder material onto the second metal containing layer; and reflowing the solder material.

34. The method of claim 33, wherein the trench comprises an upper surface, and a portion of the solder bump is formed below the upper surface.

* * * * *